United States Patent [19]

Heigl

[11] Patent Number: 4,805,779
[45] Date of Patent: Feb. 21, 1989

[54] DEVICE FOR SEPARATION OF INTEGRATED CIRCUITS

[75] Inventor: Ing. H. Heigl, Pullach-Kolbermoor, Fed. Rep. of Germany

[73] Assignee: Firma Microhandling Handhabungsgerate GmbH, Fed. Rep. of Germany

[21] Appl. No.: 21,262

[22] Filed: Mar. 3, 1987

[30] Foreign Application Priority Data

Mar. 3, 1986 [DE] Fed. Rep. of Germany ... 8605799[U]

[51] Int. Cl.⁴ .................. G01R 31/26; B09C 5/344
[52] U.S. Cl. ......................... 209/573; 324/158 F
[58] Field of Search ..................... 209/573, 574; 324/158 F, 73 AT, 73 PC

[56] References Cited

U.S. PATENT DOCUMENTS 3,701,021 10/1972 Isaac et al. ............... 324/158 F
4,498,232 2/1985 Ertl ........................ 324/158 F
4,588,092 5/1986 Moechnig et al. ............ 209/573

FOREIGN PATENT DOCUMENTS 0032274 3/1977 Japan ..................... 324/158 F

Primary Examiner—Joseph F. Peters, Jr.
Assistant Examiner—Ed L. Swinehart
Attorney, Agent, or Firm—Steele, Gould & Fried

[57] ABSTRACT

The device for separation of electrical components includes a slide track which runs obliquely downwards and is adjusted to correspond to the width of the components. A frame, intended for testing the components, is provided in the center area of the track. Above the slide track, there are a total of four levers engaging in the slide track or influencing the components in the slide track, which levers are arranged proximate one another at a distance that is approximately equal to or slightly greater than the length of the components with respect to the direction the components slide. The individual levers are activated via one single cam drive with four cams, whereby the cams are arranged so that both the first two levers and the last two levers are activated alternatingly in order to facilitate a step by step forwarding of the component resting below or against them.

8 Claims, 2 Drawing Sheets

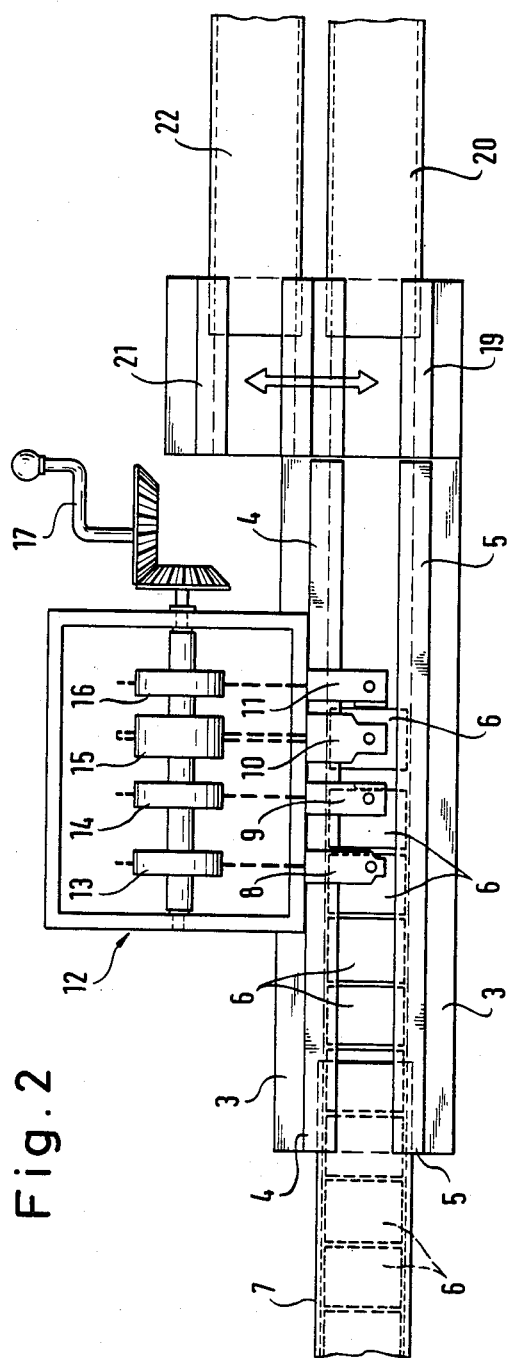
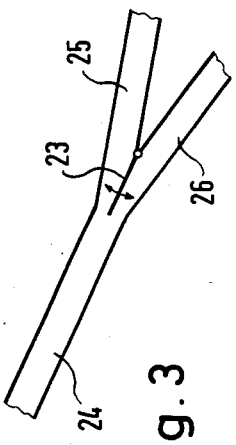
Fig. 2
Fig. 3

DEVICE FOR SEPARATION OF INTEGRATED CIRCUITS

BACKGROUND

The present innovation refers to a device for automatic separation of electrical components, particularly those sliding out of so-called IC rods, such as ICs (SMD components). Particularly, the device according to the invention is intended to be used in conjunction with automatic testing devices for the abovementioned components. ICs and other SMD components are generally transported and stored in IC rods of different lengths, the width of which is adjusted to the shape of the components.

Prior to installation of these components, they must generally be carefully tested in order to avoid that, due to the installation of a defective IC, an entirely unusable complex switching is created and consequently a deficient piece of equipment.

For testing of such components, particularly prior to installation, test equipment has become known, so-called handlers, the operation of which is fully automated, and into which the individual components are fed from a feed hopper into which they have previously been moved from the IC rods, or, they may be automatically and individually fed into the test device from the individual IC storage tubes or rods, whereafter they are deposited in various hoppers or IC rods according to the test results.

These test devices are generally fully automated and work at high rates of speed.

However, particularly in smaller electronics firms and preferably in conjunction with the receiving departments within the individual firms, there is also a need to test smaller quantities of such components at the time they are received. For this purpose, test devices exist, which are provided with a testing base onto or into which the individual components are sequentially inserted by an operator. The operator must then place the components in different containers and subsequently in corresponding IC rods, according to the test results.

This testing is extremely time-consuming and also disproportionately expensive due to the high proportion of personnel costs.

Consequently, there is a need for a mechanically functioning test device by means of which the work can be performed at a rate of speed which is higher than the simple manual handling but slower than that of the fully automated test equipment.

OBJECTS AND SUMMARY OF THE INVENTION

The purpose of the invention is to indicate a device of this nature, which particularly moves the components coming from the IC rods onto the test base, and which thereby separates them so that at any time, only one component touches the test base and which then, via a corresponding mechanism, immediately allows the tested component to be placed in an IC rod for good components or an IC rod for bad or unusuable components, according to the test result.

This problem is solved by means of a test device with the characteristics indicated in protection claim 1. Advantageous executions can be seen from the sub-claims.

The device for separation of electrical components according to the preceding definition has a slide track which runs obliquely downwards and is adjusted to correspond to the width of the components. The frame intended for testing the components is provided in the center area.

Above the slide track, there are a total of four levers engaging in the slide track or influencing the components in the slide track, which levers are arranged opposite one another at a distance that is approximately equal to or slightly greater than the length of the components, seen in the direction these are sliding. The individual levers are activated via one single cam drive with four cams, whereby the cams are arranged so that both the first two levers and the last two levers are activated alternatingly in order to facilitate a step by step forwarding of the component resting below or against them. The result of this is that in a series of components sliding down into the slide track, the first component is held against the second lever, whereby the second component arrives below the first lever. Now, the action of the two levers alternates and the first lever holds the second component, while the second lever releases the first component. This may then arrive in the area of the test base below the raised third lever, where it is pressed downwards by the third lever so that a good contact is established between the connectors on the test base and the terminal lugs on the component proper.

The test result then indicates whether the component is usable or not usable, and the third lever releases the component, and after the fourth lever has also been raised, the component slides downwards under the fourth lever. At this time, the component held by the second lever is released, and so on.

According to the innovation, two exit slide tracks are provided in the lower area of the slide unit, whereby these may be connected with the slide track as desired and which, in turn, lead to IC rods intended to accommodate the components, whereby the usable components are guided into one of the IC rods and the unusable into the other IC rod, after the exit slide tracks have been moved.

According to the preferred utilization purpose, the cam drive is hereby driven via a crank, namely in such a manner that one test procedure can be executed for each rotation of the cam drive. Thereby, it is also recommended, according to a different development, that the movement of the exit slide track is manually activated, e.g. thereby that two parallel exit slide tracks are provided, of which the one intended for the usable ICs is always flush with the working slide track. The unit of the two combined slide tracks can be dislocated against the force of a spring so that when an unusable IC is found, the second exit slide track can be brought flush with the working slide track. When the IC in question has passed, the lever activating the dislocation is released, and the status intended for forwarding usable ICs is automatically restored.

In the development of the individual cam-activated levers engaging in the slide track, it is recommended that the first lever be developed as a sensor lever which, by means of a correspondingly elastic head, lightly presses that IC which is located under it when the lever is turned inwards, against the bottom of the slide track, so that continued movement of the IC is prevented. Preferably, the second and fourth levers are provided with edge strips extending into the slide path - and, if required, adjustable with respect to their effective positions - against which the individual ICs will move when the lever is turned into the slide track and below which they can slide away when the lever is turned out of the slide track.

The third lever, which presses the individual component into the test base, is of particular importance. According to another further development of the invention concept, this lever is journalled with spring action, namely particularly in such a manner that a specific maximum pressure on the component cannot be exceeded; this pressure can be preset. Conversely, a sufficient minimum pressure is also required in order to establish contact, and this pressure must also be of a very specific magnitude.

BRIEF DESCRIPTION OF THE DRAWINGS

Details of a device according to the invention will be explained in the following with reference to the drawings. Thereby, the drawings show, in FIG. 1 a schematic side view, and in FIG. 2 a top view of those parts of a device for separating components for testing purposes which are necessary for understanding the invention.

FIG. 3 shows, in sketch form, a possible modification of the exit slide tracks.

DETAILED DESCRIPTION

Figure 1:
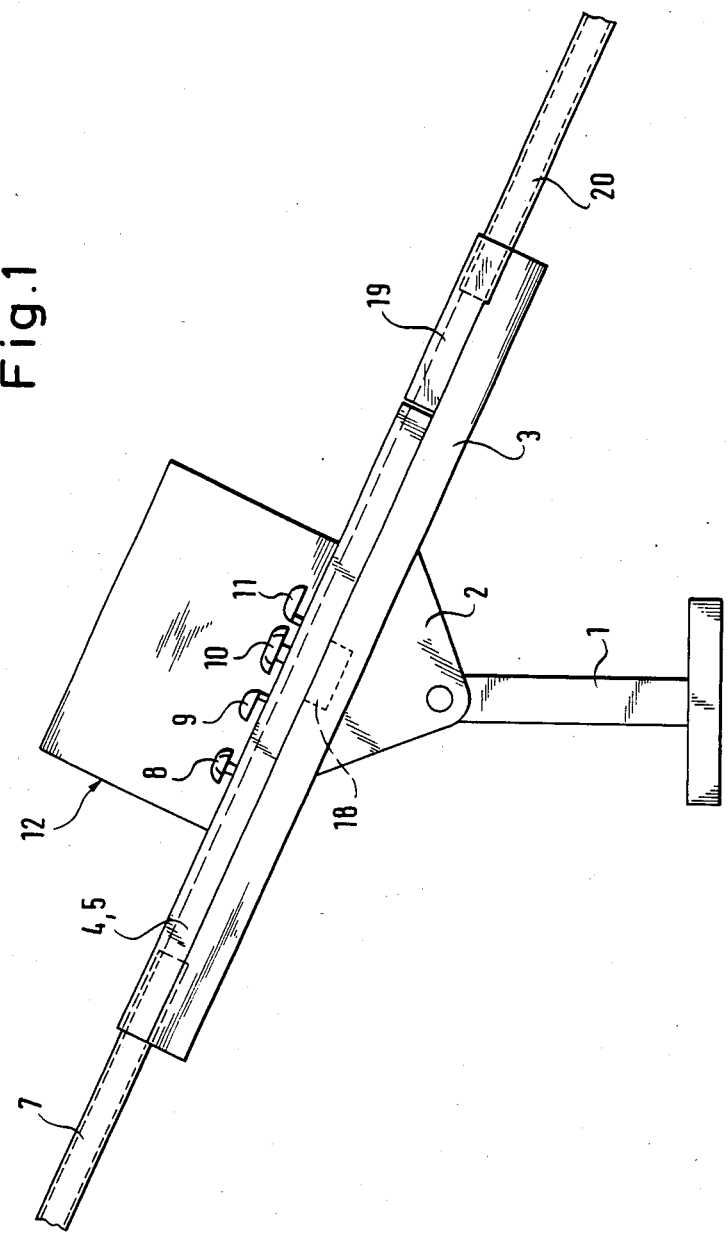

As already mentioned, only those parts which are necessary for an understanding of the invention are represented in the drawing. Design details such as for adjustment of the slope of the slide track as well as for adjusting the width of the slide track, for attaching IC rods at intake and outlet, and particularly also bearings for levers and cams, have been intentionally omitted for purposes of overview. The expert will be equipped to execute these parts, which are certainly necessary for the construction of a device according to the invention but superfluous for purposes of understanding the invention.

FIG. 1 shows a schematic side view of a device according to the invention. The substructure of the device is indicated by means of the stand 1, on which the total structure is held by means of a pivoting part 2. The pivoting makes it possible to adjust the slope of the working slide track of the device.

Thereby, the slide track is arranged on a frame part 3. Generally, it is formed by two guide rails 4 and 5, which span a free space of which the height and width are adjusted to the components. Thereby, the guide rails 4 and 5 can be moved in relation to one another so that the clearance between the guide rails can be accordingly adjusted to the components to be tested.

In order to introduce the ICs to be tested, which are collectively defined as 6, a so-called IC rod 7 is inserted to an appropriate depth into the slide track at the top left side, i.e. between the guide rails 4 and 5. It will be held in place due to the tight fit.

After the insertion, the individual ICs slide downwards into the slide track. Along the course of the slide track, there are four levers, 8, 9, 10, and 11, which can be moved out of or into the slide track via a cam drive 12 with individual cams 13, 14, 15, 16. The cam drive is manually operated via a crank 17.

Thereby, the cams are selected so that when a rotation begins, the cam 14 will first press the lever 9 downwards; as indicated by means of a dashed line, this lever has a flap pointing downwards. Accordingly, the components 6 can slide down to this lever. When the turning continues, the lever 8, which is designed as a sensor lever with a soft tip, is lowered and holds the component located below it, which was at first resting against the component held by the lever 9. Simultaneously, the lever 9 is raised and the component previously held against this lever slides into the range of the lever 10, where a test base 18 (cf FIG. 1) is provided. Here, the spring activated lever 10 is lowered, as indicated by the double dashed line between cam 15 and lever 10 in FIG. 2, and it presses the IC into the test base with the preset maximum pressure. On its left side, the lever 11 has an edge strip 50 that extends into the slide track, against which strip the component below the lever 10 was at first resting. After testing the component located below the lever 10, the lever 10 releases the component which, at this moment, is still held in its position by the lever 11 but without pressure. Thereby, it is pressed upwards and out of the test base by means of a pressure spring—not shown. If the component is classified as usable, it can slide into an exit slide track 19 after the lever 11 has been raised, and from this exit track it can immediately enter an IC rod 20. Parallel to the exit slide track 19, there is an exit slide 21, and the two form one construction unit. As indicated by means of an arrow, they can be jointly dislocated so that the exit slide track 19 is no longer flush with the working slide tracks formed by the slide rails 4 and 5, but rather the exit slide track 21 which, in turn, holds an IC rod 22.

If the test result indicates that the component below lever 10 in the test base is unusable, the operator will briefly interrupt the turning of the crank 17 and dislocate the unit of the two exit slide tracks 19 and 21 by means of a lever—not shown—in a guide—also not shown—as explained above, so that the unusable component arrives in the IC rod 22. Thereby, the bearings of the exit slide tracks are selected in such a manner that the position shown, in which the IC rod 20 is flush with the working slide track, represents the normal position, and a flush position of the IC rod 22 is achieved only through a dislocation against the spring force.

These explanations demonstrate that several design modifications are possible. Thus, for instance, a slide switch can be provided instead of two slide tracks, e.g. in such a manner that the two exit slide tracks are arranged vertically one above the other, or one slide track may be divided into two slide tracks by means of a tongue as indicated in FIG. 3. The exit slide track 24, which is schematically shown in this figure, branches into the exit slide tracks 25 and 26 whereby, when the tongue is tipped downwards, the components from 24 are guided to 25, and when the tongue is tipped upwards, they go from 24 to 26. With such a design, one must only ascertain that the slide track running over the tongue has no uneven spots against which the terminal lugs might impact.

The two exit slide tracks 19 and 21 are held in a normal position, shown in FIG. 2, by the force of spring 54. Manual lever 56 dislocates the exit track unit from the normal position by an appropriate movement. The exit track unit is returned to the normal position when lever notch 58 is released from spring support 60 due to the tension of the spring.

The structure of the cam drive to activate the levers can also be designed in various manners. In particular, a lateral arrangement of the cam drive is not necessary. It could also run above [the tracks], whereby the levers would have to be activated as tappets, and an elastic intermediate link with adjustable spring force would have to be provided at the third lever.

I claim:

1. Device for separation of electrical components, particularly integrated circuit components sliding out of storage rods, and particularly in order to make it possible to feed the components individually and in a correct position to a test base where contact can be established, characterized by a sloping slide track adjusted to the width of the components, in a center area of which a frame for testing the components has been provided, further, characterized by a total of four levers influencing the components in the slide path and located at a mutual distance equal to or slightly greater than the length of an individual component with respect to the direction of the sliding movement, all of the levers are activated in directions towards or away from the slide track by means of a common cam drive with four cams of different design, of which levers at least the third one, which is located above the test base, includes a sensor pressing the components downwards, and whereby the first and second, and the third and fourth levers work sequentially in such a manner that when the second and the fourth lever releases a component, the first and the third lever holds the component located below it, and vice versa, and further characterized by two exit slide tracks, each one of which may be selectively connected with the slide track.

2. Device according to claim 1, characterized in that the device includes means for exerting a pressure force by means of the third lever on the component in an area of the test base.

3. Device according to claim 1, characterized in that the first lever is also a sensor lever which, by means of a soft tip, holds a component onto the slide track by pressure.

4. Device according to claim 3, characterized in that the second lever and the fourth lever have stop edges along the sides, whereby the individual components slide against the edges and are held in position when the levers are moved towards the slide track.

5. Device according to claim 1, characterized in that the cam drive can be operated via a manual crank.

6. Device according to claim 1, characterized in that the exit slide tracks are arranged in parallel and are in one piece, in such a manner that when that one exit slide track is dislocated from a normal position that is flush with the slide track of the device, the other exit slide track will assume a corresponding position flush with the slide track of the device.

7. Device according to claim 6, characterized in that the two exit slide tracks comprise a unit.

8. Device according to claim 1, characterized in that ends of the slide tracks are designed to accommodate the ends of storage rods, so that the storage rods are held in place by a tight form fit.

* * * * *